United States Patent
Ishikawa

(10) Patent No.: US 10,523,020 B2
(45) Date of Patent: Dec. 31, 2019

(54) ELECTRIC STORAGE APPARATUS AND ELECTRIC-STORAGE CONTROLLING METHOD

(71) Applicant: FUJITSU TEN LIMITED, Kobe-shi, Hyogo (JP)

(72) Inventor: Yukio Ishikawa, Kobe (JP)

(73) Assignee: FUJITSU TEN Limited, Kobe (JP)

( * ) Notice: Subject to any disclaimer, the term of this patent is extended or adjusted under 35 U.S.C. 154(b) by 0 days.

(21) Appl. No.: 15/797,680

(22) Filed: Oct. 30, 2017

(65) Prior Publication Data

US 2018/0219387 A1    Aug. 2, 2018

(30) Foreign Application Priority Data

Jan. 31, 2017 (JP) ................................. 2017-016273

(51) Int. Cl.
*H02J 7/00* (2006.01)
*G01R 31/36* (2019.01)
*G01R 31/396* (2019.01)

(52) U.S. Cl.
CPC ........ *H02J 7/0014* (2013.01); *G01R 31/3648* (2013.01); *G01R 31/396* (2019.01); *H02J 7/0026* (2013.01)

(58) Field of Classification Search
CPC .. H02J 7/0014; H02J 7/0026; G01R 31/3648; G01R 31/3658; G01R 31/396
See application file for complete search history.

(56) References Cited

U.S. PATENT DOCUMENTS

| 8,933,667 B2 | 1/2015 | Park et al. |
| 2004/0160213 A1* | 8/2004 | Stanesti ............... H02J 7/0018 320/116 |
| 2012/0268070 A1 | 10/2012 | Park et al. |

(Continued)

FOREIGN PATENT DOCUMENTS

| JP | 2009-033936 A | 2/2009 |
| JP | 2014-073051 A | 4/2014 |
| JP | 2014-514692 A | 6/2014 |

OTHER PUBLICATIONS

Nov. 26, 2018 Office Action Issued in U.S. Appl. No. 15/797,951.

(Continued)

*Primary Examiner* — Nha T Nguyen
(74) *Attorney, Agent, or Firm* — Oliff PLC

(57) ABSTRACT

An electric storage apparatus according to one aspect of an embodiment includes a battery unit, a determination unit, a virtual processing unit, and a connection controlling unit. The battery unit includes storage batteries to be connected in parallel. The determination unit determines, when the battery unit is started up, a startup type indicating a discharge start or a charge start. The virtual processing unit generates connection orders. Each of the connection orders is obtained by virtually and sequentially connecting in parallel storage batteries, of the storage batteries, having potential differences within a predetermined range so as to equalize electric potentials of the storage batteries. The connection controlling unit selects, among from the connection orders, a connection order in which the equalized electric potential is an electric potential according to the startup type determined by the determination unit, so as to connect in parallel the storage batteries.

4 Claims, 9 Drawing Sheets

(56) References Cited

U.S. PATENT DOCUMENTS

| | | | | |
|---|---|---|---|---|
| 2013/0127423 A1* | 5/2013 | Liang | .................. | H01M 10/443 |
| | | | | 320/136 |
| 2013/0300370 A1* | 11/2013 | Hotta | .................. | H01M 10/425 |
| | | | | 320/117 |
| 2015/0194707 A1* | 7/2015 | Park | .................. | H01M 10/4207 |
| | | | | 429/50 |
| 2016/0084912 A1* | 3/2016 | Lee | ..................... | G01R 31/362 |
| | | | | 324/426 |
| 2016/0094065 A1* | 3/2016 | Motoichi | ............. | H02J 7/0021 |
| | | | | 320/126 |

OTHER PUBLICATIONS

U.S. Appl. No. 15/797,951, filed Oct. 30, 2017 for Applicant Ishikawa.
Jun. 13, 2019 Office Action Issued in U.S. Appl. No. 15/797,951.

* cited by examiner

ELECTRIC STORAGE APPARATUS AND ELECTRIC-STORAGE CONTROLLING METHOD

CROSS-REFERENCE TO RELATED APPLICATION

This application is based upon and claims the benefit of priority of the prior Japanese Patent Application No. 2017-016273, filed on Jan. 31, 2017 the entire contents of which are incorporated herein by reference.

FIELD

The embodiment discussed herein is directed to an electric storage apparatus and an electric-storage controlling method.

BACKGROUND

Conventionally, there exists a battery apparatus obtained by connecting in parallel a plurality of storage batteries, each of which includes a plurality of electric storage elements connected in serial to have the high voltage, so as to realize increase in capacity. In a case where the plurality of storage batteries is connected in parallel, when electric-storage states of the storage batteries are different from each other, there exists in this electric storage apparatus a risk that overcurrent flows from a storage battery having a high electric potential to a storage battery having a low electric potential, thereby leading to breakage.

Thus, there exists an electric storage apparatus in which storage batteries having small potential difference are connected in parallel when a plurality of storage batteries is to be connected in parallel and their electric potentials are equalized so as to suppress breakage caused by the above overcurrent (see Japanese Unexamined Patent Application Publication No. 2014-514692, for example).

However, the conventional electric storage apparatus connects in parallel storage batteries having small potential difference with each other without considering a startup aim of the electric storage apparatus, and thus there exists, in some cases, a case where storage batteries according to the startup aim are not connected in parallel to perform charge and discharge.

SUMMARY

An electric storage apparatus according to one aspect of an embodiment includes a battery unit, a determination unit, a virtual processing unit, and a connection controlling unit. The battery unit includes a plurality of storage batteries to be connected in parallel. The determination unit determines, when the battery unit is started up, a startup type indicating a discharge start or a charge start. The virtual processing unit generates a plurality of connection orders. Each of the connection orders is obtained by virtually and sequentially connecting in parallel two or more storage batteries, of the plurality of storage batteries, having a potential difference or potential differences within a predetermined range so as to equalize electric potentials of the two or more storage batteries. The connection controlling unit selects, among from the connection orders generated by the virtual processing unit, a connection order in which the equalized electric potential is an electric potential according to the startup type determined by the determination unit, so as to connect in parallel the two or more storage batteries.

BRIEF DESCRIPTION OF DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF EMBODIMENT

Hereinafter, an exemplary embodiment of an electric storage apparatus and an electric-storage controlling method disclosed in the present application will be described in detail with reference to the accompanying drawings. Moreover, it is not intended that the present disclosure be limited to the embodiment described below.

Figure 1:
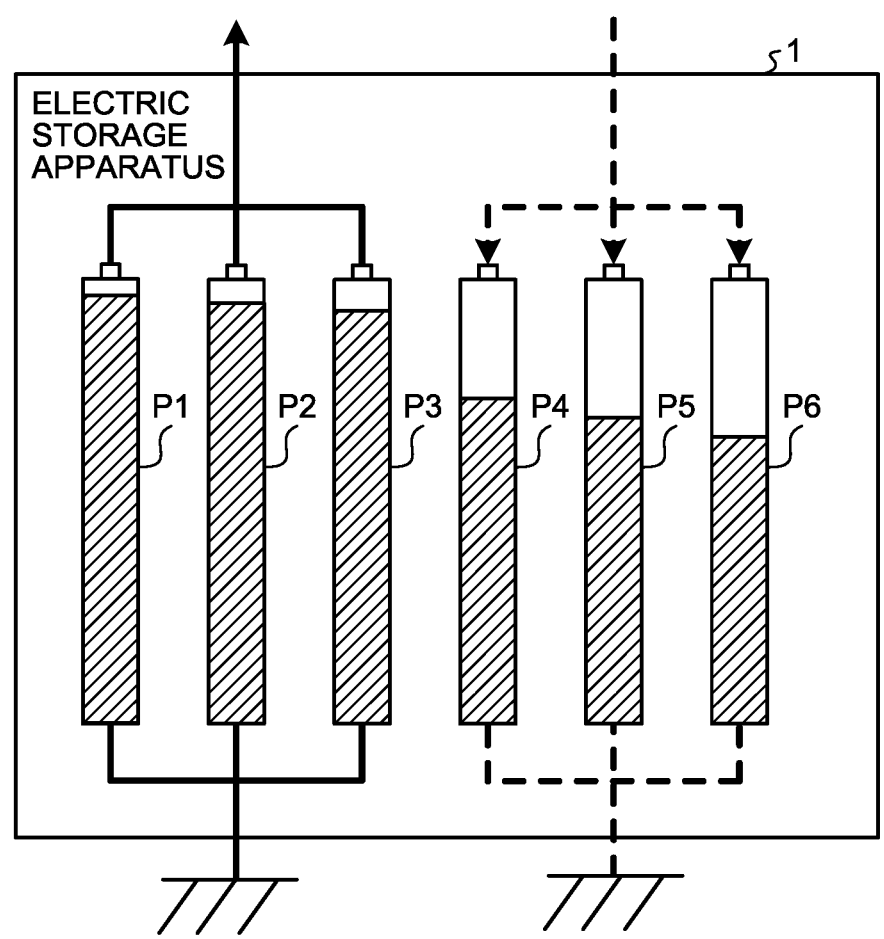
FIG. 1 is a diagram illustrating an electric-storage controlling method according to an embodiment.

FIG. 1 is a diagram illustrating the electric-storage controlling method according to the embodiment. As illustrated in FIG. 1, an electric storage apparatus 1 according to the embodiment includes a plurality of storage batteries (hereinafter, may be referred to as "packs") P1 to P6 that are to be connected in parallel. Each of the hatched parts illustrated in FIG. 1 indicates that the electric potential is higher as a hatched area is larger. The number of the packs included in the electric storage apparatus 1 illustrated in FIG. 1 is merely one example, and not limited thereto.

In a case where the plurality of packs P1 to P6, which are in different electric-storage states as illustrated in FIG. 1, are connected in parallel at one time, when a potential difference between the packs P1 to P6 is large, there exists a fear that overcurrent flows from the pack P1 having a higher electric potential to the pack P6 having a lower electric potential, for example, thereby leading to breakage of any of wires connecting the packs P1 to P6 each other, etc.

Thus, commonly, packs having small potential difference are connected in parallel with each other to equalize electric potentials of the packs, a pack having small potential difference from the equalized electric potential is further connected in parallel thereto to sequentially equalize electric potentials of the packs, whereby breakage of a wire connecting the packs with each other or the pack itself is suppressed.

In this case, in the electric storage apparatus 1, there exists a plurality of orders for connecting the parallel-connectable packs P1 to P6 without overcurrent in some cases. For example, in the example illustrated in FIG. 1, potential differences between the packs P1 to P3 are comparatively small, and thus they are connectable in parallel.

Potential differences between the packs P4 to P6 are also comparatively small, and thus they are connectable in parallel. Note that the packs P3 and P4 are not connected in parallel because a potential difference therebetweeen is large. In other words, when the packs P1 to P3 are connected in parallel, the packs P4 to P6 are not able to be connected in parallel thereto, and thus only the packs P1 to P3 are used as a power source. When the packs P4 to P6 are connected in parallel, the packs P1 to P3 are not able to be connected in parallel thereto, and thus only the packs P4 to P6 are used as a power source.

Thus, in the electric storage apparatus 1, there exists a plurality of parallel-connectable connection orders in some cases. In such a case, when the electric storage apparatus 1 selects one of the connection orders without considering a startup aim, the startup aim is not sufficiently achieved in some cases.

For example, in a case where a startup aim is charge, when sequentially connecting in parallel the packs P1 to P3, the electric storage apparatus 1 is not able to charge the packs P4 to P6 having comparatively low electric potentials that are to be charged. In a case where the startup aim is discharge, when sequentially connecting in parallel the packs P4 to P6, the electric storage apparatus 1 is not able to supply sufficient electric power to an external part because the electric potentials of the packs P4 to P6 are comparatively low.

Therefore, the electric storage apparatus 1 determines, when starting up, a startup type indicating that the start is a discharge start for starting up as a discharging device or a charge start for starting up as a charging device. In other words, "start up as discharging device" indicates a start for consuming electric power of the electric storage apparatus 1 by discharge, and a start when an ignition switch is turned from OFF to ON for starting to drive a vehicle corresponds to the discharge start, for example.

In other words, "start up as charging device" indicates a start for charging the electric storage apparatus 1, and a start when the electric storage apparatus 1 is charged from a charger outside of a vehicle in a charging stand, home, etc. corresponds to the charge start, for example. Moreover, the electric storage apparatus 1 executes a virtual process for virtually and sequentially connecting the packs in parallel, among the packs P1 to P6, whose potential differences are within a predetermined range to equalize the electric potentials.

The electric storage apparatus 1 selects, among from the two connection orders of the packs P1 to P3 and the packs P4 to P6 that are able to be virtually connected in parallel by the virtual process, a connection order in which an equalized electric potential when the packs are connected in parallel in the selected connection order is according to a startup type, and connects the packs in parallel.

Thus, as indicated by a bold-solid-line arrow illustrated in FIG. 1, when a startup type is a discharge start, the electric storage apparatus 1 connects in parallel, for example, the packs P1 to P3 whose equalized electric potential is comparatively high and is able to perform discharge.

As indicated by bold-dashed-line arrows illustrated in FIG. 1, when a startup type is a charge start, the electric storage apparatus 1 connects in parallel the packs P4 to P6 whose equalized electric potential is comparatively low and is able to perform charge. Thus, by employing the electric storage apparatus 1, it is possible to connect in parallel the packs P1 to P3 or the packs P4 to P6, which are according to a startup aim, and perform charge or discharge.

In the electric storage apparatus 1, there exists a case where the number of parallel-connectable packs and an equalized electric potential when the packs P1 to P6 are sequentially connected in parallel in the order from highest electric potential to lowest one are different from those when the packs P1 to P6 are sequentially connected in parallel in the order from lowest electric potential to highest one.

This point will be mentioned later with reference to FIGS. 4A to 4C, in this case, when a startup type is a discharge start, the electric storage apparatus 1 selects a connection order having the maximum number of parallel-connectable packs in the order from highest electric potential to lowest one.

When a startup type is a charge start, the electric storage apparatus 1 selects a connection order having the maximum number of parallel-connectable packs in the order from lowest electric potential to highest one. Thus, the electric storage apparatus 1 is able to connect in parallel more of the packs P1 to P6 in accordance with a startup aim to perform charge or discharge.

Figure 2:
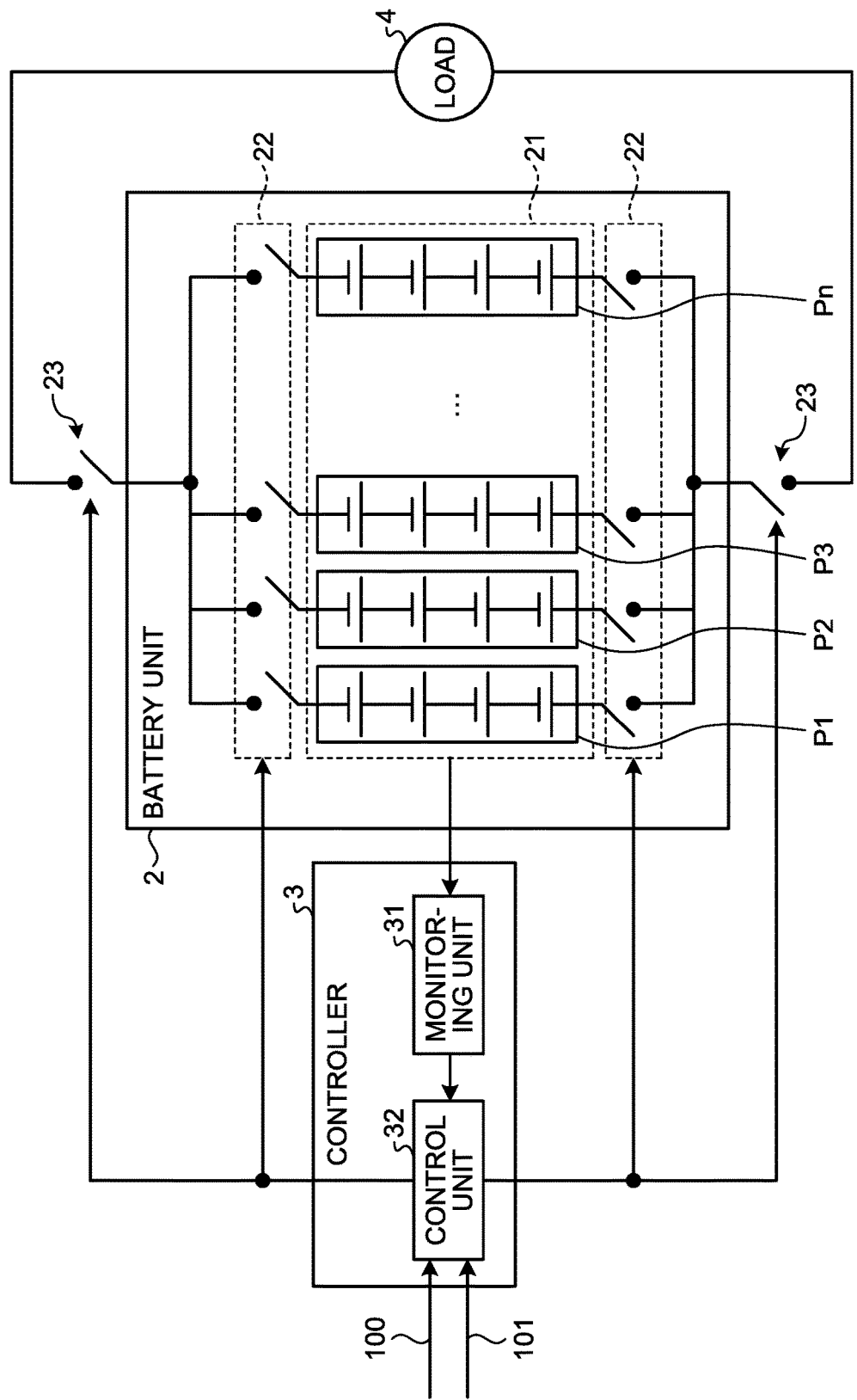
FIG. 2 is a diagram illustrating a configuration example of an electric storage apparatus according to the embodiment.

Next, a configuration example of the electric storage apparatus 1 according to the embodiment will be explained with reference to FIG. 2. FIG. 2 is a diagram illustrating a configuration example of the electric storage apparatus 1 according to the embodiment. A case will be explained as an example in which the electric storage apparatus 1 is provided in a hybrid automobile.

The electric storage apparatus 1 is discharged when supplying electric power to a load 4 such as a motor for driving a vehicle and another on-vehicle device, and is charged by drive energy of an engine or regenerative energy generated when the vehicle decelerates. Moreover, the electric storage apparatus 1 is charged by an external charger (not illustrated). The electric storage apparatus 1 may be applied to an arbitrary electric storage system including a secondary battery, such as an electric automobile and a Home Energy Management System (HEMS).

As illustrated in FIG. 2, the electric storage apparatus 1 includes a battery unit 2, a controller 3, and a main relay 23. The battery unit 2 includes an electric storage unit 21 in which the plurality of packs P1, P2, P3, . . . , Pn (n is natural number) is provided, and a sub-relay unit 22.

Herein, when an arbitrary pack among the plurality of packs P1, P2, P3, . . . , Pn is indicated, the pack is to be referred to as a pack P. Each of the packs P includes a plurality of serially-connected electric storage elements. The sub-relay unit 22 includes a plurality of sub-relays that is able to individually connect in parallel the plurality of packs P.

The controller 3 includes a monitoring unit 31 and a control unit 32. The monitoring unit 31 is realized by hardware such as an Application Specific Integrated Circuit (ASIC) and a Field Programmable Gate Array (FPGA). The monitoring unit 31 detects the electric potentials of the packs P and outputs the detected result to the control unit 32.

The control unit 32 includes, for example, a Central Processing Unit (CPU), a Read Only Memory (ROM), a Random Access Memory (RAM), a microcomputer including an input/output port, and various circuits. A part or a whole of the control unit 32 may be constituted of hardware such as an ASIC and a FPGA.

The control unit 32 is a processing unit for performing ON/OFF control on the main relay 23 and for performing ON/OFF control on each of the sub-relays included in the sub-relay unit 22. When a startup signal 100 for starting charge or discharge by the battery unit 2 is input from the vehicle, this control unit 32 outputs, before the main relay 23 is turned ON, a control signal to the sub-relay unit 22 to connect the parallel-connectable packs P with each other, and equalizes the electric potentials of the parallel-connected packs P.

The startup signal 100 includes information on a startup type indicating a discharge start for starting the battery unit 2 as a discharging device or a charge start for starting the battery unit 2 as a charging device. For example, when an ignition switch (not illustrated) is turned ON, the startup signal 100 is output, in advance of a drive start, from a vehicle along with information indicating a discharge start. When a charging connector of an external charger (not illustrated) is connected with a charging connector (not illustrated) on a vehicle, the startup signal 100 is output, in advance of a charge start, from the vehicle along with information indicating the charge start.

The control unit 32 determines whether the start is a discharge start or a charge start on the basis of information on a startup type, which is included in the input startup signal 100, and connects the packs P in parallel in a connection order to obtain an electric potential according to the startup type, so as to equalize the electric potentials of the packs P.

A setting signal 101 is input from the vehicle to the control unit 32, which is for setting, when a connection order of the packs P is selected, one of a number-of-packs prioritizing setting for prioritizing a largeness of the number of the connectable packs P and a startup-type prioritizing setting for prioritizing a startup type.

When applying the number-of-packs prioritizing setting, the control unit 32 selects, regardless of a startup type, a connection order for safely connecting in parallel more of the packs P and connects the packs P in parallel so as to equalize the electric potentials of the connected packs P.

When applying the startup-type prioritizing setting, the control unit 32 connects in parallel the packs P in a connection order for obtaining the electric potential according to a startup type so as to equalize the electric potentials of the packs P. For example, when a startup type is a discharge start, the control unit 32 connects in parallel the packs P in a connection order including the more high electric potential packs P than other connection orders among a plurality of connection orders. Thus, the electric storage apparatus 1 is able to connect in parallel the packs P that are suitable for a discharge start and to perform discharge.

When a startup type is a charge start, the control unit 32 connects in parallel the packs P in a connection order including the more low electric potential packs P than other connection orders among a plurality of connection orders. Thus, the electric storage apparatus 1 is able to connect in parallel the packs P that are suitable for a charge start and to perform charge.

In a case where the startup-type prioritizing setting is applied, when the number of the packs P to be connected in parallel in a connection order for obtaining the electric potential according to a startup type is extremely small, the control unit 32 may be configured to perform a control for connecting in parallel the packs P in a connection order derived by applying the number-of-packs prioritizing setting.

When equalization of the electric potentials of the parallel-connected packs P is completed, the control unit 32 outputs a control signal to the main relay 23 to connect the battery unit 2 and a motor that is the load 4 or to connect the battery unit 2 and an external charger (not illustrated) and causes the battery unit 2 to start charge or discharge.

Next, when a termination signal for terminating the charge or discharge performed by the battery unit 2 is input from the vehicle, the control unit 32 outputs a control signal to the main relay 23 so as to disconnect the battery unit 2 from the motor that is the load 4 or disconnect the battery unit 2 from the external charger (not illustrated), and executes again a process for equalizing the electric potentials of the packs.

Figure 3:
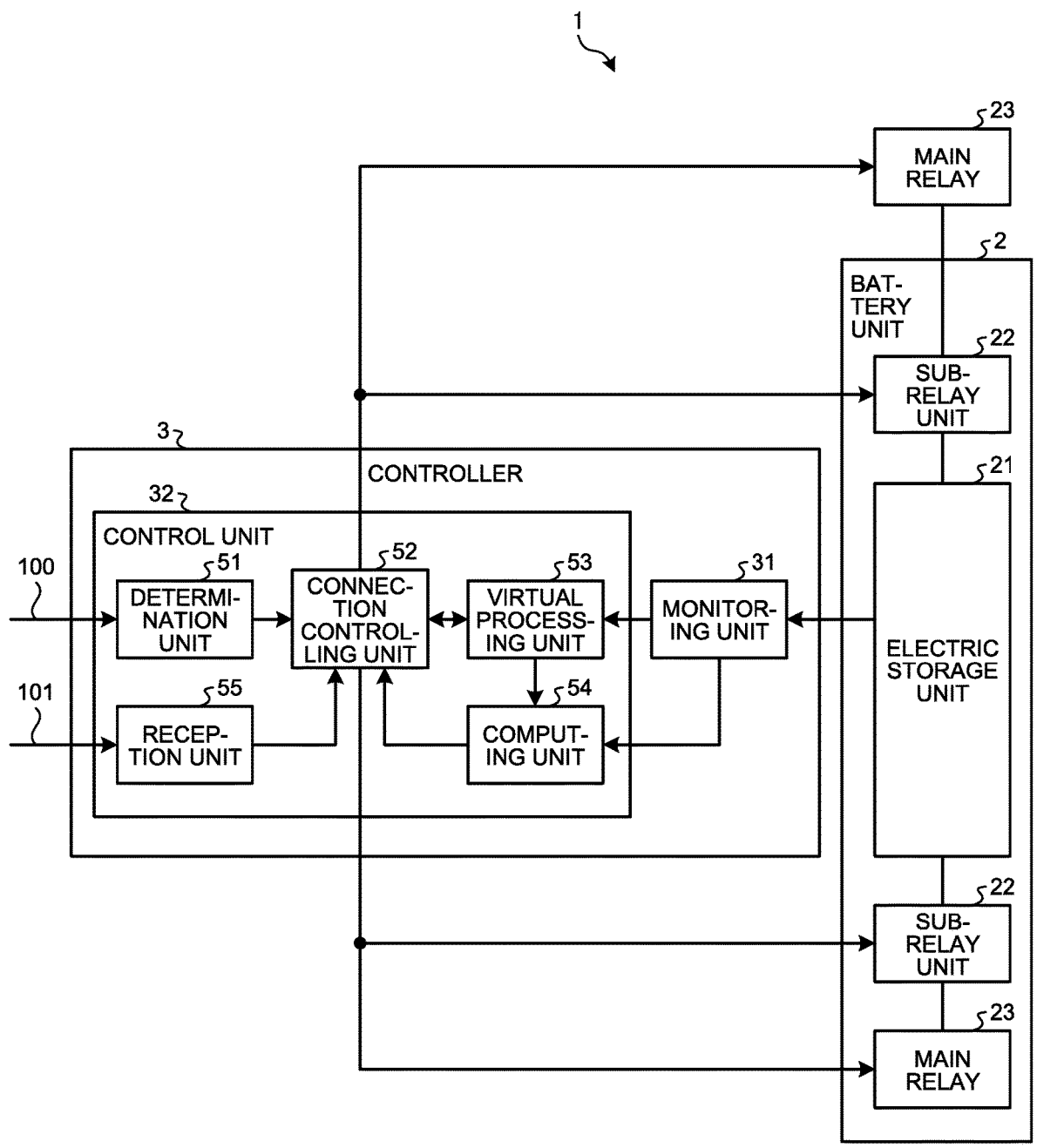
FIG. 3 is a functional block diagram illustrating the electric storage apparatus according to the embodiment.

Hereinafter, a configuration and operates of the control unit 32 will be explained more specifically with reference to FIGS. 3 to 5. FIG. 3 is a functional block diagram illustrating the electric storage apparatus 1 according to the embodiment. FIGS. 4A to 5 are diagrams illustrating parallel connection operations of packs that are to be performed by the control unit 32 according to the embodiment. Note that in the following, among the configuration elements illustrated in FIG. 3, configuration elements that are the same as those illustrated in FIG. 2 are represented with same symbols and the description is omitted appropriately.

As illustrated in FIG. 3, the control unit 32 includes a determination unit 51, a connection controlling unit 52, a virtual processing unit 53, a computing unit 54, and a reception unit 55. The CPU uses the RAM as a work area to execute an electric-storage controlling program (not illustrated) stored in the ROM to function them.

The determination unit 51 is a processing unit for determining, when the startup signal 100 for starting the battery unit 2 is input, whether a startup type is a discharge start or a charge start on the basis of information on a startup type included in the startup signal 100 and for outputting the determination result to the connection controlling unit 52.

The reception unit 55 determines, when the setting signal 101 is input, whether a setting is the number-of-packs prioritizing setting or the startup-type prioritizing setting on the basis of information on a setting type included in the setting signal 101, and outputs the determination result to the connection controlling unit 52.

The connection controlling unit 52 is a processing unit for performing ON/OFF control on the main relay 23 and ON/OFF control on the sub-relays included in the sub-relay unit 22 on the basis of information input from the determination unit 51, the reception unit 55, the virtual processing unit 53, and the computing unit 54.

When the determination result of the startup type is input from the determination unit 51, the connection controlling unit 52 outputs to the virtual processing unit 53 an instruction to start a virtual process for deriving connection orders of the parallel-connectable packs P. The connection controlling unit 52 acquires, from the virtual processing unit 53, the plurality of connection orders derived by the virtual process, selects a connection order according to a startup type and a setting type among from them, and outputs to the sub-relay unit 22 a control signal for connecting in parallel the packs P in the selected connection order.

The virtual processing unit 53 is a processing unit that derives a plurality of connection orders of the parallel-connectable packs P and outputs the connection orders to the connection controlling unit 52 and the computing unit 54. When a start instruction of the virtual process is input from the connection controlling unit 52, the virtual processing unit 53 first acquires the electric potentials of the packs P from the monitoring unit 31.

In this case, when a potential difference between the pack P having the maximum electric potential and the pack P having the minimum electric potential is equal to or less than a predetermined threshold, overcurrent does not flow even when all of the packs P are connected in parallel. On the other hand, when the potential difference between the pack P having the maximum electric potential and the pack P having the minimum electric potential is more than the predetermined threshold, there exists a fear that overcurrent flows to break the battery unit 2 when all of the packs P are connected in parallel.

Thus, the virtual processing unit 53 determines whether or not the potential difference between the pack P having the highest electric potential and the pack P having the lowest electric potential is equal to or less than a predetermined threshold, when the potential difference is equal to or less than the threshold, the virtual processing unit 53 outputs a signal indicating the fact to the connection controlling unit 52.

When the signal, which indicates that the potential difference between the pack P having the highest electric potential and the pack P having the lowest electric potential is equal to or less than the predetermined threshold, is input from the virtual processing unit 53, the connection controlling unit 52 outputs a control signal for sequentially turning ON the sub-relays to the sub-relay unit 22.

In this case, a value of the synthesized resistance of the packs P is smaller as the number of the parallel-connected packs P is larger. Thus, the connection controlling unit 52 connects in parallel the packs P having a large potential difference with each other while the synthesized resistance is large so as to keep the amount of current that flows between the parallel-connected packs P to be small, and reduces a damage to the battery unit 2 that is to be caused by the parallel connection of the packs P. In other words, the connection controlling unit 52 sequentially connects in parallel the packs P in the order from largest potential difference to smallest one.

Next, the connection controlling unit 52 acquires the electric potentials of the packs P from the monitoring unit 31 through the virtual processing unit 53, when the electric potentials of the packs P are equalized, determines that equalization of the electric potentials is completed, and outputs a control signal for turning ON the main relay 23 to the main relay 23.

When determining that the potential difference between the pack P having the highest electric potential and the pack P having the lowest electric potential is more than the predetermined threshold, the virtual processing unit 53 executes the virtual process for virtually and sequentially connecting the packs P having a small potential difference with each other so as to derive a connection order in which more of the packs P are able to be connected in parallel.

In this case, there exists, in some cases, a case where the number of the parallel-connectable packs P and an equalized electric potential after completion of the parallel connection when the packs P are connected in parallel in the order from highest electric potential to lowest one are different from those when the packs P are connected in parallel in the order from lowest electric potential to highest one.

This point will be explained with reference to FIGS. 4A to 4C. For example, as illustrated in FIG. 4A, it is assumed that there exist the pack P1 having the electric potential of 10 volts, the pack P2 having the electric potential of 8 volts, and the pack P3 having the electric potential of 7 volts. Description will be advanced under the assumption that overcurrent flows when a potential difference between the packs to be connected in parallel exceeds 2 volts.

Figure 4A:
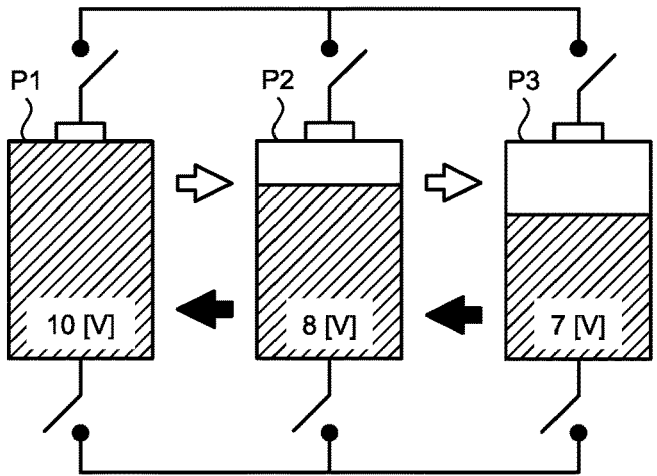
FIGS. 4A to 5 are diagrams illustrating parallel connection operations of packs that are to be performed by a control unit according to the embodiment.
Figure 4B:
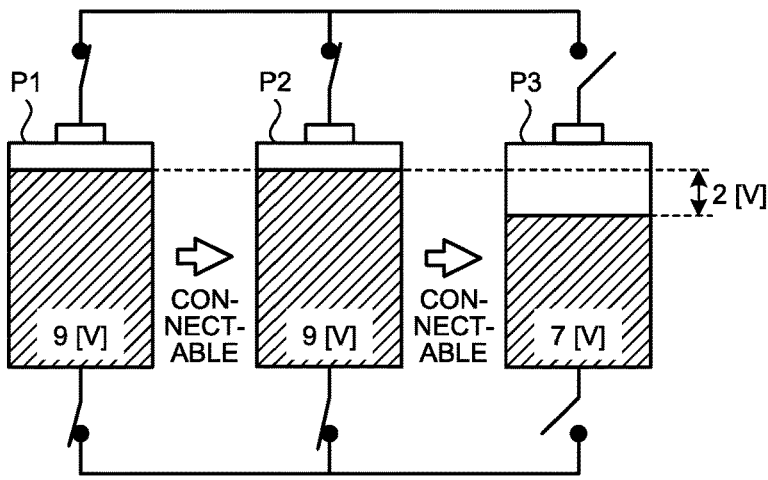
Figure 4C:
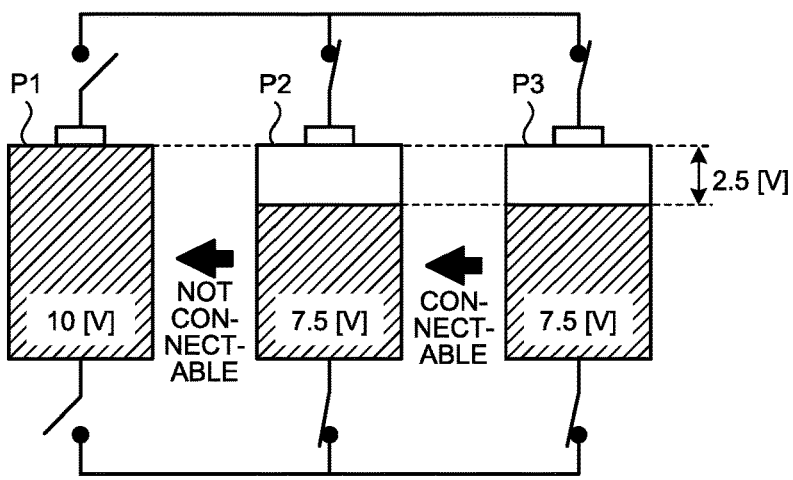
Figure 5:
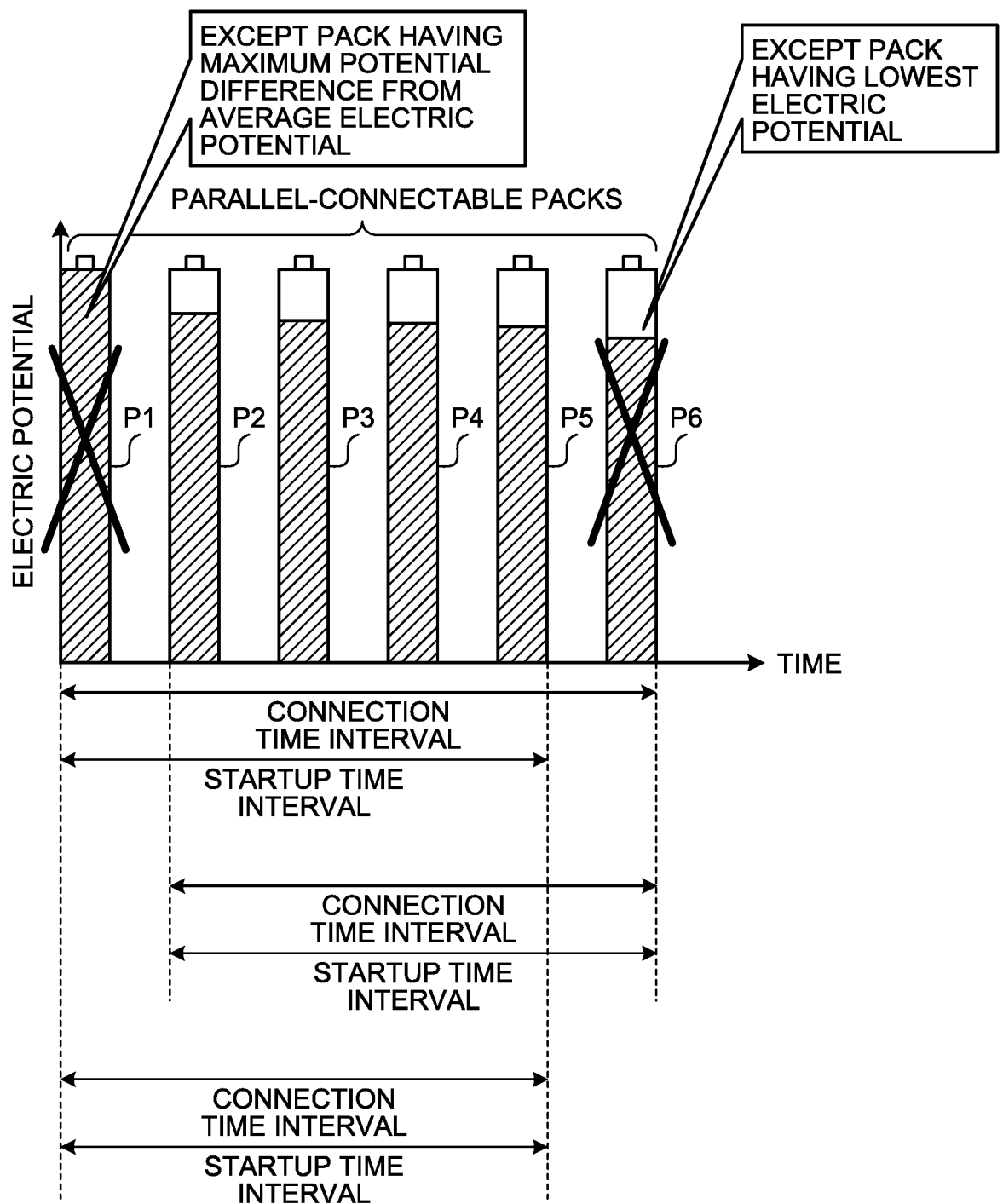

In this case, there exists a case where the number of the connectable packs P and the equalized electric potential when the packs P are connected in the order from highest electric potential to lowest one as indicated by white arrows illustrated in FIG. 4A are different from those when the packs P are connected in the order from lowest electric potential to highest one as indicated by black arrows illustrated in FIG. 4A.

Specifically, as illustrated in FIG. 4A, when packs are virtually and sequentially connected in parallel in the order from highest electric potential to lowest one, the electric potential of the pack P1 is 10 volts, the electric potential of the pack P2 is 8 volts, and thus a potential difference therebetween is 2 volts, whereby overcurrent does not flow even when the packs P1 and P2 are connected in parallel. Thus, as illustrated in FIG. 4B, when the packs P1 and P2 are connected in parallel, the electric potentials of the packs P1 and P2 are equalized to be 9 volts.

In this case, the electric potential of the pack P3 to be next connected is 7 volts and a potential difference from the equalized electric potential of the packs P1 and P2 is 2 volts, and thus overcurrent does not flow when the pack P3 is connected in parallel with the packs P1 and P2. Thus, the pack P3 is able to be further connected in parallel.

Therefore, when packs are connected in parallel in the order from highest electric potential to lowest one, the number of parallel-connectable packs without overcurrent is three. An equalized electric potential when the three packs P1, P2, P3 are connected in parallel is approximately 8.3 volts.

On the other hand, as illustrated in FIG. 4A, when packs are virtually and sequentially connected in parallel in the order from lowest electric potential to highest one, the electric potential of the pack P3 is 7 volts, the electric potential of the pack P2 is 8 volts, and thus a potential difference therebetween is 1 volt, whereby overcurrent does not flow even when the packs P2 and P3 are connected in parallel. Thus, as illustrated in FIG. 4C, when the packs P2 and P3 are connected in parallel, the electric potentials of the packs P2 and P3 are equalized to be 7.5 volts.

In this case, the electric potential of the pack P1 to be next connected is 10 volts and a potential difference from the equalized electric potential of the packs P2 and P3 is 2.5 volts, and thus overcurrent is to flow when the packs P2 and P3 are connected in parallel. Thus, the pack P1 is not able to be further connected in parallel.

Therefore, when packs are connected in parallel in the order from lowest electric potential to highest one, the number of parallel-connectable packs P without overcurrent is two. An equalized electric potential of the two packs P2 and P3 when they are connected in parallel is 7.5 volts.

In this manner, in the state illustrated in FIG. 4A, the number of the parallel-connectable packs P and an equalized electric potential after parallel connection when the packs P are connected in parallel in the order from highest electric potential to lowest one are larger than those when the packs P are connected in parallel in the order from lowest electric potential to highest one.

In a state illustrated in FIG. 4A, the number of parallel-connectable packs is larger when the packs P are sequentially connected in parallel in the order from highest electric potential to lowest one, there exists a case where the number of connectable packs is larger when the packs P are sequentially connected in parallel in the order from lowest electric potential to highest one depending on the electric potentials or potential differences of the packs.

Therefore, when determining that the potential difference between the pack P having the highest electric potential and the pack P having the lowest electric potential is larger than a predetermined threshold, the virtual processing unit 53 executes a virtual process for virtually and sequentially connecting in parallel the packs P in the order from highest electric potential to lowest one and a virtual process for virtually and sequentially connecting in parallel the packs P in the order from lowest electric potential to highest one.

Specifically, when a potential difference between the pack P having the highest electric potential and that having the second highest electric potential is within a predetermined range, the virtual processing unit 53 first virtually connects in parallel this pair of the packs P and computes an equalized electric potential of the pair of the packs P.

Next, when a potential difference between the equalized electric potential and the next highest electric potential of the pack P is within a predetermined range, the virtual processing unit 53 repeatedly executes a process for further virtually connecting in parallel thereto this pack P so as to equalize the electric potentials.

When a potential difference between the equalized electric potential and the pack P having the next highest electric potential exceeds the predetermined range, the virtual processing unit 53 determines that the packs P having been virtually connected in parallel by then are the parallel-connectable packs.

Next, the virtual processing unit 53 repeatedly executes a process for sequentially and virtually connecting in parallel the parallel-connectable packs P again in the order from highest electric potential to lowest one, from the pack P having the highest electric potential that is next higher than the electric potential of the pack P having finally determined to be parallel-connectable, namely, the pack P first determined not to be parallel-connectable so as to equalize the electric potentials.

The virtual processing unit 53 performs this virtual parallel connection up to the pack P having the lowest electric potential, as a result, derives a connection order of the packs P for maximizing the number of the parallel-connectable packs P, and outputs the derived connection order of the packs P to the connection controlling unit 52.

Next, the virtual processing unit 53 repeatedly executes a process for sequentially and virtually connecting in parallel the parallel-connectable packs P also in the order from lowest electric potential to highest one with respect to all of the packs P so as to equalize the electric potentials of the packs P. When the parallel-connectable packs P are sequentially and virtually connected in parallel in the order from lowest electric potential to highest one, the virtual processing unit 53 derives a connection order of the packs P for maximizing the number of the parallel-connectable packs P, and outputs the derived connection order of the packs P to the connection controlling unit 52.

Note that, the virtual processing unit 53 may execute the virtual process for virtually connecting in parallel the packs P in the order from lowest electric potential to highest one, and then execute the virtual process for virtually connecting in parallel the packs P in the order from highest electric potential to lowest one.

In this manner, the virtual processing unit 53 virtually connects in parallel the packs P in the order from highest electric potential to lowest one and outputs, to the connection controlling unit 52, a connection order for maximizing the number of the parallel-connectable packs and virtually connects in parallel the packs P in the order from lowest electric potential to highest one and outputs, to the connection controlling unit 52, a connection order for maximizing the number of the parallel-connectable packs.

In this case, when the packs P are connected in the connection order for maximizing the number of the parallel-connectable packs, there exists, in some cases, a case where a time interval (hereinafter, may be referred to as "connection time interval") to be spent until the electric potentials of the packs P are equalized exceeds a startup time interval of the battery unit 2. This startup time interval is a predetermined time interval from an input of the startup signal 100 to the control unit 32 to turning ON of the main relay 23.

The virtual processing unit 53 also outputs, to the computing unit 54, the connection order of the packs P for maximizing the number of the parallel-connectable packs P. The computing unit 54 computes a connection time interval obtained in a case where the packs P are virtually connected in parallel in the connection order that is input from the virtual processing unit 53, on the basis of the electric potentials of the packs P that are input from the monitoring unit 31. The computing unit 54 outputs the computed connection time interval to the connection controlling unit 52.

When a connection time interval input from the computing unit 54 exceeds the startup time interval of the battery unit 2, the connection controlling unit 52 preliminarily reduces the number of the packs P to be connected in parallel so that the connection time interval is within the startup time interval of the battery unit 2, and temporary stores the connection order.

For example, as illustrated in FIG. 5, when at most six packs of the packs P1 to P6 are parallel-connectable in the order from highest electric potential to lowest one, there exists a case where a connection time interval of the six packs P1 to P6 exceeds the startup time interval of the battery unit 2.

In this case, the connection controlling unit 52 excepts, from targets to be connected in parallel, the pack P1, among the six pack P1 to P6, having a maximum potential difference from the average electric potential of the packs P1 to P6, when the connection time interval does not exceed the startup time interval, stores a connection order of the five packs P2 to P6.

In a case where the connection time interval still exceeds the startup time interval even when the pack P1 is excepted and the five packs P2 to P6 are connected in parallel, the connection controlling unit 52 repeatedly excepts the pack P having a maximum potential difference from the average electric potential, and stores a connection order for maximizing the number of the packs P whose connection time interval is kept within the startup time interval.

When the pack P6 among the six packs P1 to P6, which has the lowest electric potential, is excepted from targets to be connected in parallel and a connection time interval does not exceed the startup time interval, the connection controlling unit 52 stores a connection order of the five packs P1 to P5.

In a case where the connection time interval still exceeds the startup time interval even when the pack P6 is excepted to connect in parallel the remaining five packs P1 to P5, the connection controlling unit 52 repeatedly excepts the pack P having the lowest electric potential, and stores a connection order for maximizing the number of the packs P whose connection time interval is kept within the startup time interval. When a connection time interval of the six packs P1 to P6 does not exceed the startup time interval, the connection controlling unit 52 stores a connection order of the six packs P1 to P6.

When a connection time interval of the maximum number of the packs P, which are parallel-connectable in the order from lowest electric potential to highest one, exceeds the startup time interval, the connection controlling unit 52 repeatedly excepts the pack P having a maximum potential difference from an average electric potential of the connectable packs, and stores a connection order of the maximum number of the packs P whose connection time interval is kept within the startup time interval.

When a connection time interval of the maximum number of the packs P, which are connectable in parallel in the order from lowest electric potential to highest one, exceeds the startup time interval, the connection controlling unit 52 repeatedly excepts the pack P having the lowest electric potential, and stores a connection order for maximizing the number of the packs P whose connection time interval is kept within the startup time interval. When the connection time interval of the maximum number of the packs P that are connectable in parallel in the order from lowest electric potential to highest one does not exceed the startup time interval, the connection controlling unit 52 stores the connection order.

The connection controlling unit 52 selects, among from the plurality of above stored connection orders, a connection order according to the number-of-packs prioritizing setting or the startup-type prioritizing setting. For example, when the number-of-packs prioritizing setting is applied, the connection controlling unit 52 selects a connection order for maximizing the number of parallel-connectable packs among from the plurality of above stored connection orders.

The connection controlling unit 52 outputs, to the sub-relay unit 22, a control signal for connecting in parallel the packs P in the selected connection order. Thus, the connection controlling unit 52 is able to connect the maximum number of the parallel-connectable packs P.

When the startup-type prioritizing setting is applied, the connection controlling unit 52 selects a connection order according to a discharge start or a charge start. For example, when a start is the discharge start, the connection controlling unit 52 selects a connection order for maximizing the equalized electric potential, when a start is the charge start, the connection controlling unit 52 selects a connection order for minimizing the equalized electric potential.

The connection controlling unit 52 outputs, to the sub-relay unit 22, a control signal for connecting in parallel the packs P in the selected connection order. Next, when the equalization of the electric potentials of the parallel-connected packs P is completed, the connection controlling unit 52 outputs, to the main relay 23, a control signal for turning ON the main relay 23 so as to connect the battery unit 2 and the load 4.

Thus, the connection controlling unit 52 is able to connect in parallel more of the connectable packs P in accordance with a startup aim to perform charge and discharge without delaying a start of the battery unit 2.

The connection control on the packs P to be performed by the connection controlling unit 52 is not limited thereto. In a case where the startup-type prioritizing setting is applied, when the number of the packs P to be connected in parallel in a connection order for obtaining the electric potential according to the startup type is extremely small, the connection controlling unit 52 may be configured to connect in parallel the packs P in a connection order derived by applying the number-of-packs prioritizing setting.

For example, in a case where the startup-type prioritizing setting is applied, when a value obtained by subtracting a number Y2 of the connectable packs P based on the startup-type prioritizing setting from a number Y1 of the parallel-connectable packs P based on the number-of-packs prioritizing setting is larger than a predetermined value, the connection controlling unit 52 may apply the number-of-packs prioritizing setting. In this case, the predetermined value to be applied may be arbitrarily set.

The subtraction process for subtracting the number Y2 from the number Y1 is not always to be executed, it is sufficient that the same result is obtained. In other words, when the number Y1 is larger than the number Y2 by a predetermined value or more, the number-of-packs prioritizing setting may be applied.

Thus, in a case where the startup-type prioritizing setting is applied, when the number of the packs P to be connected in parallel in a connection order according to a startup type is extremely small than the number of the connectable packs based on the number-of-packs prioritizing setting, the connection controlling unit 52 is able to connect in parallel more of the packs P.

Next, processes to be executed by the controller 3 of the electric storage apparatus 1 will be explained with reference to FIGS. 6 to 9. FIGS. 6 to 9 are flowcharts illustrating procedures for processes to be executed by the controller 3 of the electric storage apparatus 1 according to the embodiment. In FIG. 7, processes to be executed by the controller 3 from an input of the startup signal 100 to parallel connection of the parallel-connectable packs P are illustrated.

Figure 6:
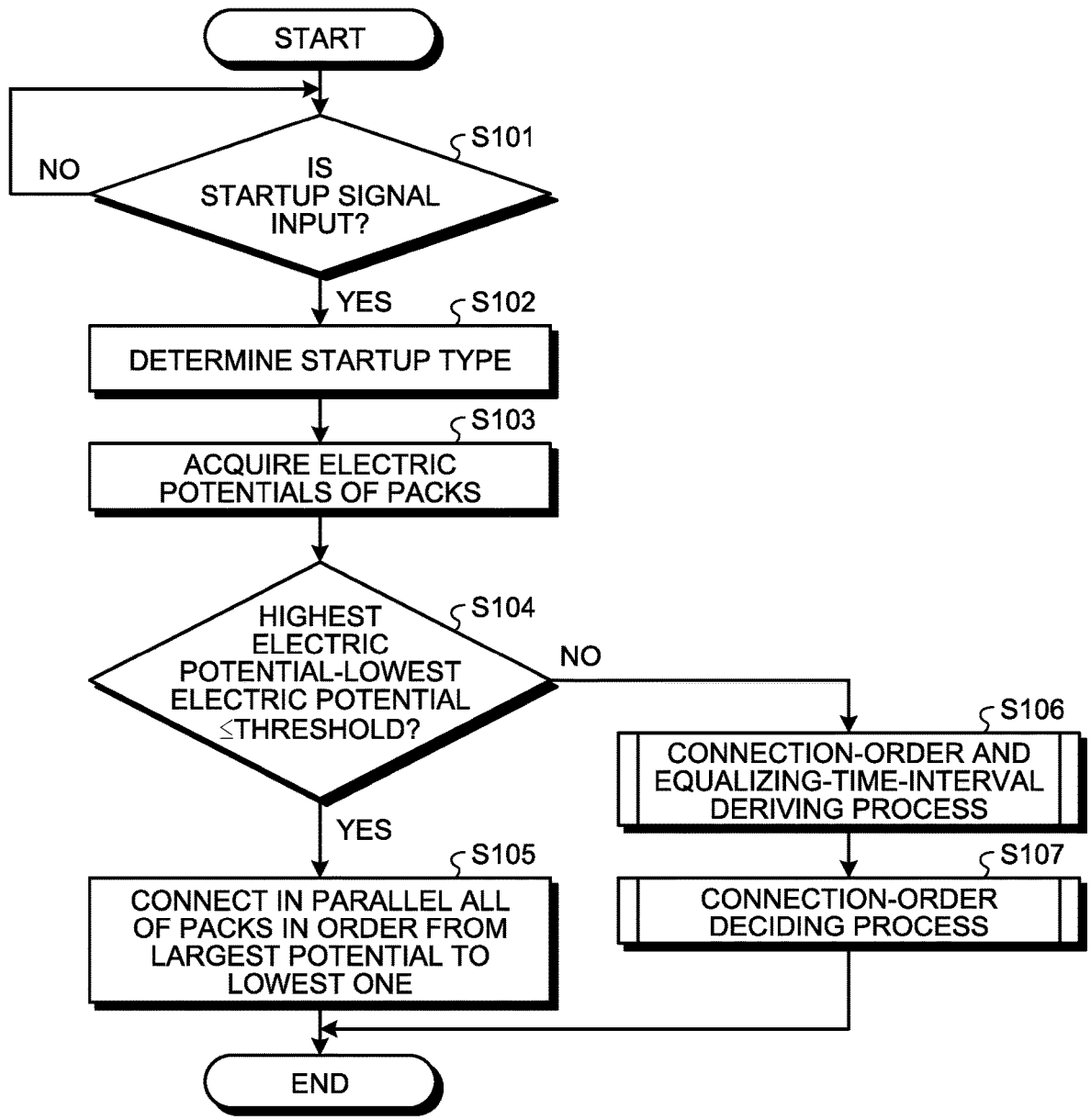
FIGS. 6 to 9 are flowcharts illustrating procedures for processes to be executed by the controller of the electric storage apparatus according to the embodiment.
Figure 7:
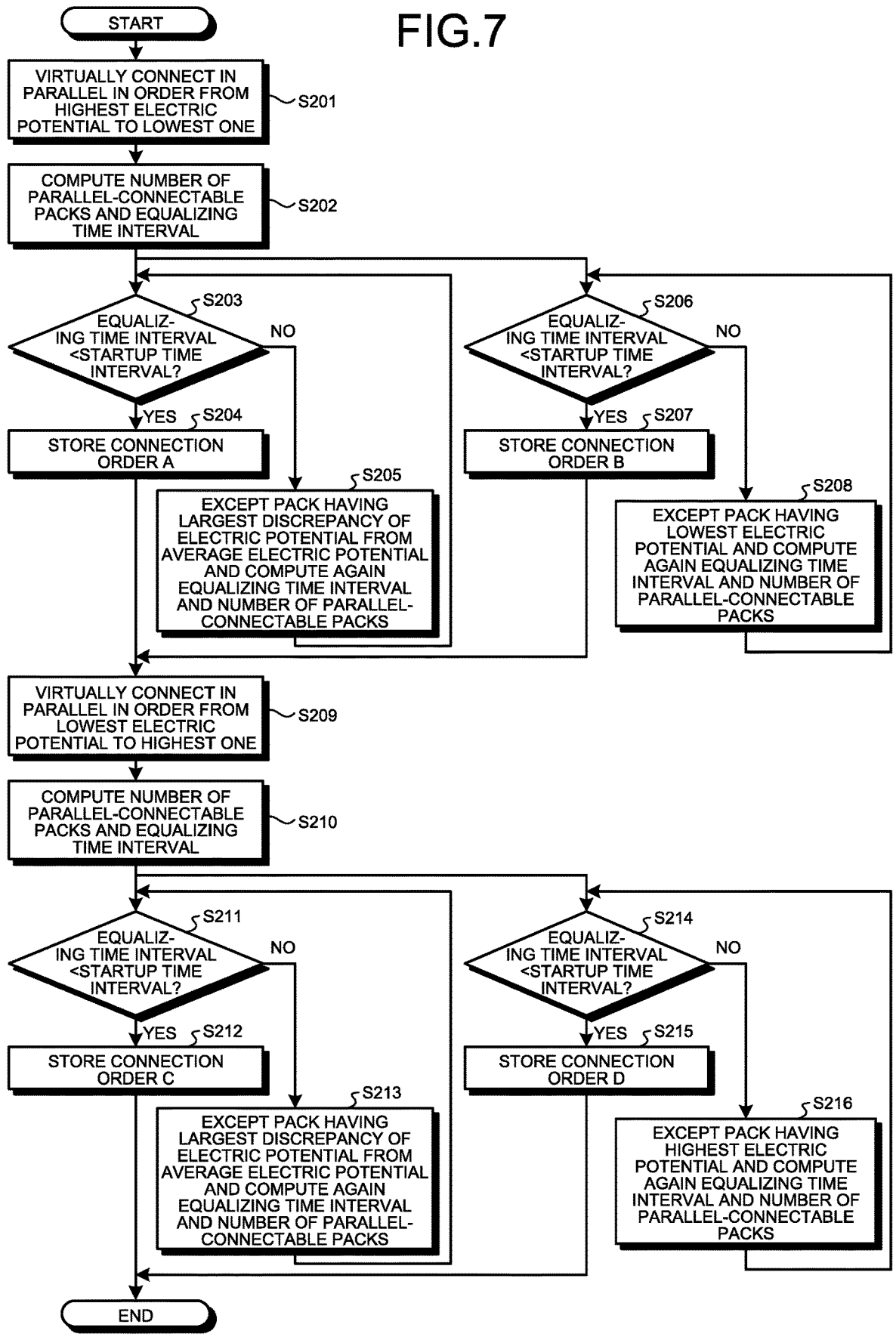

As illustrated in FIG. 6, the controller 3 first determines whether or not the startup signal 100 is input (Step S101). When determining that the startup signal 100 is not input (Step S101: No), the controller 3 repeatedly perform the determination of Step S101 until the startup signal 100 is input.

When determining that the startup signal 100 is input (Step S101: Yes), the controller 3 determines a startup type of the startup signal 100 (Step S102). In this case, the controller 3 determines whether the startup type is a charge start or a discharge start.

Subsequently, the controller 3 acquires the electric potentials of the packs P (Step S103). Next, the controller 3 determines whether or not a value obtained by subtracting the lowest electric potential of the electric potentials of the packs P from the highest electric potential is equal to or less than a threshold (Step S104).

When determining that a value obtained by subtracting the lowest electric potential from the highest electric potential is equal to or less than the threshold (Step S104: Yes), the controller 3 connects in parallel all of the packs P in the order from largest potential difference to smallest one (Step S105), and terminates the process. When the electric potentials of the parallel-connected packs P are equalized, the controller 3 turns ON the main relay 23 (not illustrated).

When determining that the value obtained by subtracting the lowest electric potential from the highest electric potential is more than the threshold (Step S104: No), the controller 3 executes a connection-order and equalizing-time-interval deriving process (Step S106).

The controller 3 executes the equalizing-time-interval deriving process to derive a plurality of connection orders of the parallel-connectable packs P, and computes time intervals for equalizing the electric potentials of the packs P when the packs P are connected in parallel in the respective connection orders. Details of the connection-order and equalizing-time-interval deriving process will be mentioned later with reference to FIG. 7.

Subsequently, the controller 3 executes a connection-order deciding process (Step S107). The controller 3 executes the connection-order deciding process to decide a connection order of the packs P to be actually connected in parallel, and actually connects in parallel the packs P in the decided connection order. Details of this connection-order deciding process will be mentioned later with reference to FIG. 8.

The controller 3 executes the connection-order deciding process, and then terminates the process. The controller 3 actually connects in parallel the packs P in the connection order decided by the connection-order deciding process, and then turns ON the main relay 23 (not illustrated).

Next, the connection-order and equalizing-time-interval deriving process will be explained with reference to FIG. 7. As illustrated in FIG. 7, when starting the connection-order and equalizing-time-interval deriving process, the controller 3 virtually connects in parallel the parallel-connectable packs P in the order from highest electric potential to lowest one (Step S201).

Subsequently, the controller 3 computes the number of the parallel-connectable packs and an equalizing time interval (Step S202). This equalizing time interval is a time interval from parallel connection of the packs P that are determined to be parallel-connectable packs to equalization of the electric potentials of the packs P.

Next, the controller 3 executes in parallel processes of Steps S203 and S206. In Step S203, the controller 3 determines whether or not the equalizing time interval is less than the startup time interval of the battery unit 2. When determining that the equalizing time interval is equal to or more than the startup time interval (Step S203: No), the controller 3 shifts the process to Step S205.

In Step S205, the controller 3 excepts, from the parallel-connectable packs, the pack P having the largest discrepancy of the electric potential from an average electric potential to compute again an equalizing time interval and the number of parallel-connectable packs, and shifts the process to Step S203. When determining that the equalizing time interval is less than the startup time interval (Step S203: Yes), the controller 3 stores a connection order A of the packs P, whose equalizing time interval is less than the startup time interval (Step S204), and shifts the process to Step S209.

In Step S206, the controller 3 determines whether or not the equalizing time interval is less than the startup time interval of the battery unit 2. When determining that the equalizing time interval is equal to or more than the startup time interval (Step S206: No), the controller 3 shifts the process to Step S208.

In Step S208, the controller 3 excepts, from the parallel-connectable packs, the pack P having the lowest electric potential to compute again the equalizing time interval and the number of parallel-connectable packs, and shifts the process to Step S206. When determining that the equalizing time interval is less than the startup time interval (Step S206: Yes), the controller 3 stores a connection order B of the packs P, whose equalizing time interval is less than the startup time interval (Step S207), and shifts the process to Step S209.

In Step S209, the controller 3 virtually connects in parallel the parallel-connectable packs P in the order from lowest electric potential to highest one, and then computes the number of parallel-connectable packs and the equalizing time interval (Step S210).

Next, the controller 3 executes in parallel processes of Steps S211 and S214. In Step S211, the controller 3 determines whether or not the equalizing time interval is less than the startup time interval of the battery unit 2. When determining that the equalizing time interval is equal to or more than the startup time interval (Step S211: No), the controller 3 shifts the process to Step S213.

In Step S213, the controller 3 excepts, from the parallel-connectable packs, the pack P having the maximum discrepancy of the electric potential from an average electric potential to compute again an equalizing time interval and the number of parallel-connectable packs, and shifts the process to Step S211.

When determining that the equalizing time interval is less than the startup time interval (Step S211: Yes), the controller 3 stores a connection order C of the packs P, whose equalizing time interval is less than the startup time interval (Step S212), and terminates the connection-order and equalizing-time-interval deriving process. The controller 3 subsequently executes the connection-order deciding process.

In Step S214, the controller 3 determines whether or not the equalizing time interval is less than the startup time interval of the battery unit 2. When determining that the equalizing time interval is equal to or more than the startup time interval (Step S214: No), the controller 3 shifts the process to Step S216.

In Step S216, the controller 3 excepts, from the parallel-connectable packs, the pack P having the highest electric potential to compute again the equalizing time interval and the number of parallel-connectable packs, and shifts the process to Step S214. When determining that the equalizing time interval is less than the startup time interval (Step S214: Yes), the controller 3 stores a connection order D of the packs P, whose equalizing time interval is less than the startup time interval (Step S215), and terminates the connection-order and equalizing-time-interval deriving process. The controller 3 subsequently executes the connection-order deciding process.

Figure 8:
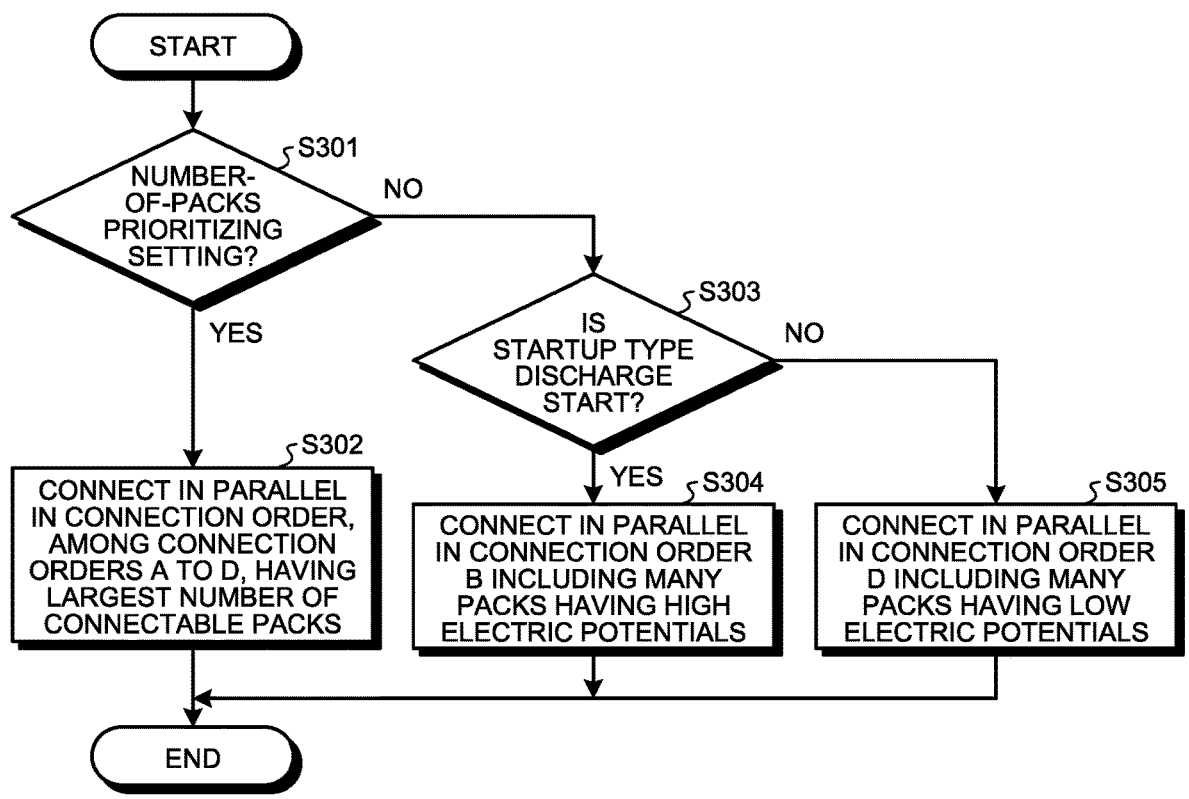

Next, the connection-order deciding process will be explained with reference to FIG. 8. As illustrated in FIG. 8, when starting the connection-order deciding process, the controller 3 determines whether or not a present applied setting is the number-of-packs prioritizing setting (Step S301).

When determining that the present applied setting is the number-of-packs prioritizing setting (Step S301: Yes), the controller 3 shifts the process to Step S302. In Step S302, the controller 3 connects in parallel the packs P in a connection order, among the connection orders A to D of the packs P stored by the connection-order and equalizing-time-interval deriving process, having the largest number of connectable packs (Step S302), and terminates the process.

When determining that the present applied setting is not the number-of-packs prioritizing setting (Step S301: No), the controller 3 determines that the present applied setting is the startup-type prioritizing setting, and shifts the process to Step S303. In Step S303, the controller 3 determines whether or not a startup type is a discharge start, when determining that the startup type is the discharge start (Step S303: Yes), the controller 3 connects in parallel the packs P in the connection order B including the many packs P having the high electric potentials (Step S304), and terminates the process.

When determining that the startup type is not the discharge start (Step S303: Yes), the controller 3 determines that the startup type is a charge start, connects in parallel the packs P in the connection order D including the many packs P having the low electric potentials (Step S305), and terminates the process.

As described above, in a case where the number of the packs P to be connected in parallel in a connection order for obtaining the electric potential according to the startup type is extremely small even when the startup-type prioritizing setting is applied, the controller 3 may connect in parallel the packs P in a connection order derived by applying the number-of-packs prioritizing setting.

Figure 9:
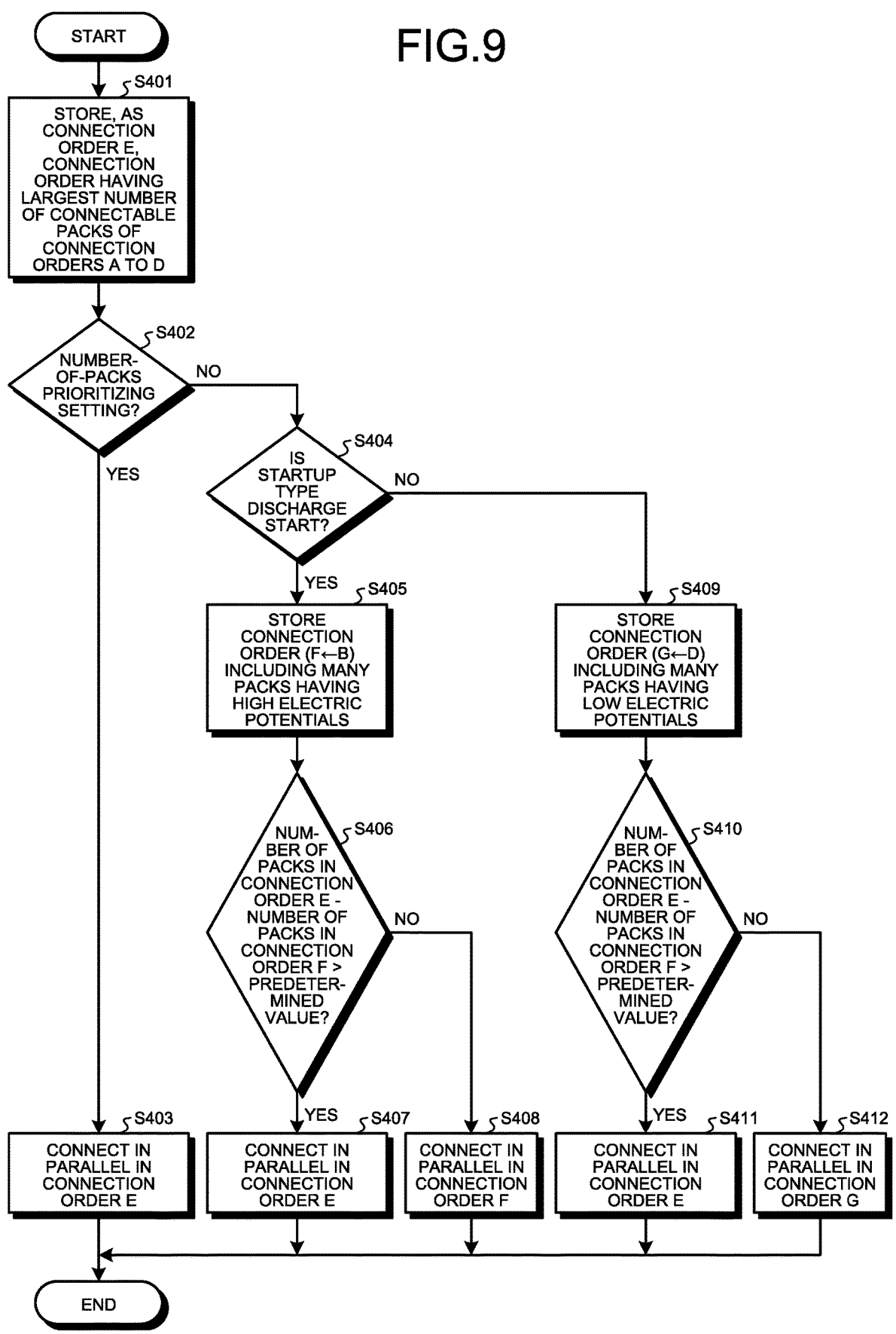

In this case, the controller 3 executes, instead of the connection-order deciding process illustrated in FIG. 8, the connection-order deciding process illustrated in FIG. 9. As illustrated in FIG. 9, the controller 3 stores, as a connection order E, a connection order, of the connection orders A to D derived in the connection-order and equalizing-time-interval deriving process, having the largest number of connectable packs (Step S401). Subsequently, the controller 3 determines whether or not a present applied setting is the number-of-packs prioritizing setting (Step S402).

When determining that the present applied setting is the number-of-packs prioritizing setting (Step S402: Yes), the controller 3 connects in parallel the packs P in the connection order E (Step S403), and terminates the process. When determining that the present applied setting is not the number-of-packs prioritizing setting (Step S402: No), the controller 3 determines whether or not a startup type is a discharge start (Step S404).

When determining that the startup type is the discharge start (Step S404: Yes), the controller 3 stores, as a connection order F, the connection order B including the many packs P having the high electric potentials (Step S405). Subsequently, the controller 3 determines whether or not a value, which is obtained by subtracting the number of the packs P to be connected in parallel in the connection order F from that in the connection order E, is larger than a predetermined value (Step S406).

When determining that the subtracted value is larger than the predetermined value (Step S406: Yes), the controller 3 connects in parallel the packs P in the connection order E (Step S407), and terminates the process. When determining that the subtracted value is equal to or less than the predetermined value (Step S406: No), the controller 3 connects in parallel the packs P in the connection order F (Step S408), and terminates the process.

When determining that the startup type is not a discharge start (Step S404: No), the controller 3 stores, as a connection order G, the connection order D including the many packs P having the low electric potentials (Step S409). Subsequently, the controller 3 determines whether or not a value, which is obtained by subtracting the number of the packs P to be connected in parallel in the connection order G from that in the connection order E, is larger than a predetermined value (Step S410).

When determining that the subtracted value is larger than the predetermined value (Step S410: Yes), the controller 3 connects in parallel the packs P in the connection order E (Step S411), and terminates the process. When determining that the subtracted value is equal to or less than the predetermined value (Step S410: No), the controller 3 connects in parallel the packs P in the connection order G (Step S412), and terminates the process.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electric storage apparatus comprising:
    a battery group that includes at least three storage batteries to be connected in parallel; and
    a processor configured to:
        determine when the battery group is started up, a startup type indicating a discharge start for starting up the battery group as a discharging device or a charge start for starting up the battery group as a charging device;
        generate a plurality of connection orders, each of the connection orders being obtained by virtually and sequentially connecting in parallel three or more storage batteries having potential differences within a predetermined range, among the at least three storage batteries, so as to equalize electric potentials of the three or more storage batteries;
        select, from the generated plurality of connection orders, a connection order in which the equalized electric potential obtained by connecting in parallel the three or more storage batteries is an electric potential according to the determined startup type;
        receive, as a setting to be applied when one of the connection orders is selected, one of a number-of-storage-batteries prioritizing setting for prioritizing a magnitude of a number of the three or more storage batteries to be connected and a startup-type prioritizing setting for prioritizing the startup type;
        apply the number-of-storage-batteries prioritizing setting when a value obtained by subtracting a number of the three or more storage batteries to be connected in parallel based on the startup-type prioritizing setting from a number of the three or more storage batteries to be connected in parallel based on the number-of-storage-batteries prioritizing setting is greater than a predetermined value in a case where the startup-type prioritizing setting is applied; and
        connect in parallel the three or more storage batteries in the selected connection order,
    wherein when the startup type is the discharge start, one of the connection orders including more storage batteries having high electric potentials than other connection orders is selected and when the startup type is the charge start, one of the connection orders including more storage batteries having low electric potentials than other connection orders is selected.

2. The electric storage apparatus according to claim 1, wherein the processor is further configured to:
    derive numbers of the three or more storage batteries to be connected in parallel when the three or more storage batteries are virtually connected in parallel in an order from a highest electric potential to a lowest electric potential and when the corresponding three or more storage batteries are virtually connected in parallel in an order from a lowest electric potential to a highest electric potential;
    select, when the startup type is the discharge start, one of the connection orders for maximizing one of the numbers of the three or more storage batteries to be connected in parallel in the order from a highest electric potential to a lowest electric potential; and
    select, when the startup type is the charge start, one of the connection orders for maximizing one of the numbers of the three or more storage batteries to be connected in parallel in the order from a lowest electric potential to a highest electric potential.

3. The electric storage apparatus according to claim 2, wherein the processor is further configured to connect in parallel, among the three or more storage batteries of the selected connection order, storage batteries that are able to be connected in parallel, within a predetermined startup time interval of the battery group.

4. An electric-storage controlling method to be performed by a processor, the method comprising:

determining, when a battery group including at least three storage batteries to be connected in parallel is started up, a startup type indicating a discharge start for starting up the battery group as a discharging device or a charge start for starting up the battery group as a charging device;

generating a plurality of connection orders, each of the connection orders being obtained by virtually and sequentially connecting in parallel three or more storage batteries having potential differences within a predetermined range, among the at least three storage batteries, so as to equalize electric potentials of the three or more storage batteries;

selecting, from the generated plurality of connection orders, a connection order in which the equalized electric potential obtained by connecting in parallel the three or more storage batteries is an electric potential according to the determined startup type;

receiving, as a setting to be applied when one of the connection orders is selected, one of a number-of-storage-batteries prioritizing setting for prioritizing a magnitude of a number of the three or more storage batteries to be connected and a startup-type prioritizing setting for prioritizing the startup type;

applying the number-of-storage-batteries prioritizing setting when a value obtained by subtracting a number of the three or more storage batteries to be connected in parallel based on the startup-type prioritizing setting from a number of the three or more storage batteries to be connected in parallel based on the number-of-storage-batteries prioritizing setting is greater than a predetermined value in a case where the startup-type prioritizing setting is applied; and connecting in parallel the three or more storage batteries in the selected connection order, wherein when the startup type is the discharge start, one of the connection orders including more storage batteries having high electric potentials than other connection orders is selected and when the startup type is the charge start, one of the connection orders including more storage batters having low electric potentials than other connection orders is selected.

\* \* \* \* \*